United States Patent [19]

Carpenter et al.

[11] Patent Number: 4,912,597

[45] Date of Patent: Mar. 27, 1990

[54] ASSEMBLY OF ELECTRIC IMPEDANCE ELEMENTS

[75] Inventors: Ronnie L. Carpenter, Bonita; Frank Cathell, Descanso, both of Calif.

[73] Assignee: Qualidyne Systems, San Diego, Calif.

[21] Appl. No.: 390,957

[22] Filed: Aug. 9, 1989

[51] Int. Cl.[4] .............................................. H01G 4/38
[52] U.S. Cl. .................................................... 361/329
[58] Field of Search ......................... 361/328, 329, 330

[56] References Cited

U.S. PATENT DOCUMENTS

| | | | |
|---|---|---|---|
| 1,821,803 | 9/1931 | Haefely | 361/329 |
| 1,845,130 | 2/1932 | Coursey | 361/329 |
| 3,372,308 | 3/1968 | Noschese et al. | 361/329 |
| 4,389,703 | 6/1983 | Morel et al. | 363/61 |
| 4,677,523 | 6/1987 | Kauppi | 361/329 |
| 4,737,745 | 4/1988 | Doepker | 333/183 |

*Primary Examiner*—Donald A. Griffin
*Attorney, Agent or Firm*—Lowe, Price, Leblanc, Becker & Shur

[57] ABSTRACT

A capacitor bank includes first and second spaced opposite polarity DC bus bars and first and second spaced printed circuit boards that extend between the bus bars. A single face of the printed circuit boards includes first and second mutually insulated metal cladding segments. Plural first and second main capacitors have first and second opposite polarity electrodes extending from a single face thereof. The main capacitors, bus bars and plates are positioned and electrically connected to each other so that; the first electrodes of the first capacitors are electrically connected to the first bus bar via the first segment of the first printed circuit board, the second electrodes of the first capacitors are electrically connected to the second bus bar via the second segment of the first printed circuit board, the first electrodes of the second capacitors are electrically connected to the first bus bar via the first segment of the second printed circuit board, and the second electrodes of the second capacitors are electrically connected to the second bus bar via the second segment of the second printed circuit board. Ripple suppression capacitors having a capacitive value considerably less than the capacitive value of the first and second capacitors have terminals connected to the first and second electrodes via the first and second segments. The filter capacitors are positioned so they straddle the dielectric stripe.

32 Claims, 3 Drawing Sheets

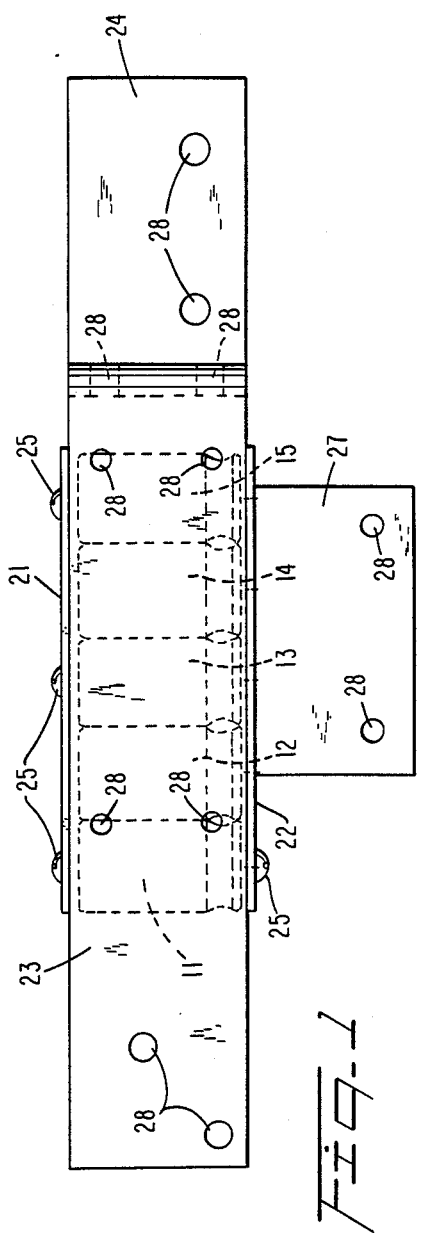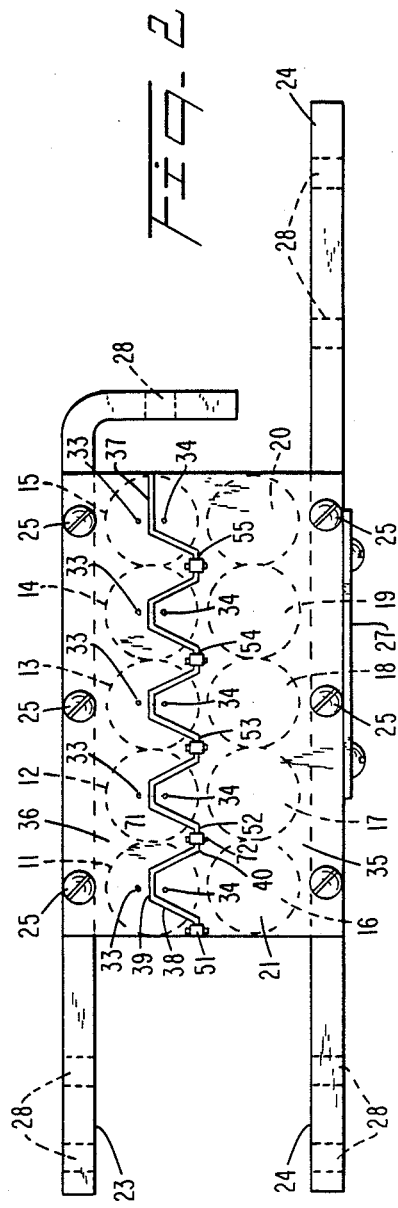

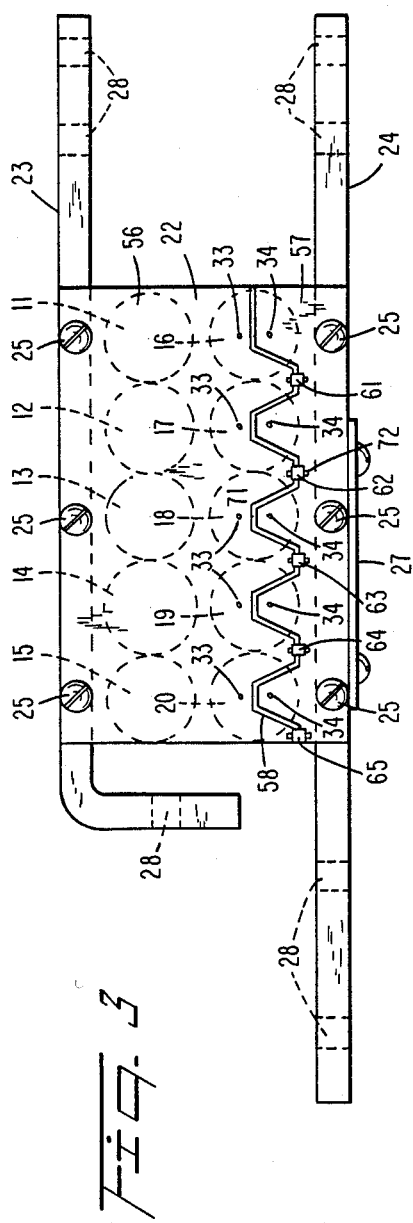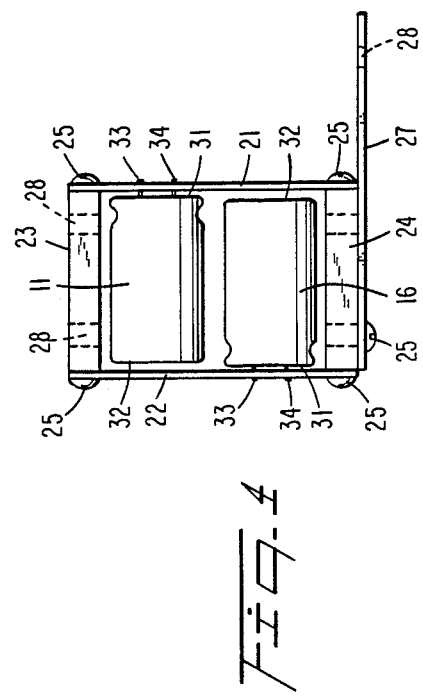

ASSEMBLY OF ELECTRIC IMPEDANCE ELEMENTS

FIELD OF INVENTION

The present invention relates generally to an assembly of electric impedance elements and more particularly to a bank of electric impedance elements wherein first and second plural impedance elements having first and second opposite polarity terminals extending from a single side thereof are positioned and electrically connected to opposite polarity first and second bus bars so that the first terminals of the first impedance elements are electrically connected to the first bus bar via a first electrically conducting segment of a first plate, the second terminals of the first impedance elements are electrically connected to the second bus bar via a second electrically conducting segment of the first plate, the first terminals of the second impedance elements are electrically connected to the first bus bar via a firs electrically conducting segment of a second plate and the second terminals of the second impedance elements are electrically connected to the second bus bar via a second electrically conducting segment of the second plate, wherein the first and second segments of the first and second plates are electrically insulated from each other.

BACKGROUND ART

Constant strides are being made in minimizing the volume for storing energy. Efforts in this direction are particularly applicable to power supplies of delivering energy to electronic devices, particularly computers and related components. In one such power supply, pulsating current is supplied to the load via a low pass filter, to remove ripple and other deleterious components. Such a filter includes many capacitors, between a pair of opposite polarity DC bus bars. It is desirable to minimize the volume required for these filter capacitors which store a considerable portion of the energy supplied to the load.

It is also desirable to arrange the capacitors so they are connected to the bus bars in a very facile, automated manner, such as through the use of a wave-solder process. It is also desirable for heat to be removed easily from the assemblage of capacitors.

To assist in minimizing ripple and other high frequency components, it is common practice for opposite polarity electrodes of main energy storing filter capacitors to be shunted by other filter capacitors having a much smaller volume and a much smaller capacitive value than the main capacitors. However, in the past inclusion o the filter capacitors in a high power, high energy capacitor assembly has created certain problems, particularly with regard to volumetric requirements.

It is, accordingly, an object of the present invention to provide a new and improved assembly of impedance elements having improved volumetric density power characteristics.

Another object of the invention is to provide a new and improved assembly of capacitors, wherein the capacitors are connected to a pair of opposite polarity bus bars in a relatively small volume, while providing high output power to a load.

Another object of the present invention is to provide a new and improved array of main capacitors capable of storing substantial amounts of energy and supplying the stored energy to a load, in combination with ripple removing capacitors having a much smaller volume than the main capacitors, wherein the ripple suppressing capacitors are easily connected in circuit with the main capacitors and are arranged so they do not substantially increase the array volume.

An additional object of the invention is to provide a new and improved assembly of high energy storing capacitors that are connected across a pair of DC bus bars and are arranged in a minimum volume, that is designed to promote cooling of the capacitors.

DISCLOSURE OF THE INVENTION

In accordance with one aspect of the invention, an assembly of electric impedance elements, preferably capacitors having high energy-density properties, includes first and second spaced bus bars at different voltages in combination with first and second spaced plates extending between the first and second bus bars. In the preferred application, the impedance elements are capacitors. Each of the plates has first and second spaced mutually insulated electrically conducting segments. Plural first and second ones of the impedance elements are provided. The impedance elements have first and second opposite polarity terminals that extend from a single face thereof. The impedance elements, bus bars and plates are positioned and electrically connected to each other so that the first terminals of the first impedance elements are electrically connected to the first bus bar via the first segment of the first plate, the second terminals of the second impedance elements are electrically connected to the second bus bar via the second segment of the first plate, the first terminals of the second impedance elements are electrically connected to the first bus bar via the first segment of the second plate, and the second terminals of the second impedance elements are electrically connected to the second bus bar via the second segment of the second plate.

In the preferred embodiment, to minimize the volumetric requirements, the first and second conducting segments are on a common face of a dielectric board so that the dielectric of the board electrically insulates the first and second conducting segments from each other. Preferably, the first and second conducting segments on each board are formed as metal claddings on the common face of the board.

The bus bars are disposed substantially parallel to each other so that first edges of the first and second bus bars are substantially aligned and second edges of the first and second bus bars are substantially aligned. The plates are electrically and mechnically connected to the bus bars so the first segment of the first plate is secured to the first edge of the first bus bar, the second segment of the first plate is secured to the first edge of the second bus bar, the first segment of the second plate is secured to the second edge of the first bus bar, and the second segment of the second plate is secured to the second edge of the second bus bar. The connections between the terminals of the impedance elements, the electrically conducting segments of the plates and the bus bars are preferably established by a wave-soldering process. The capacitors are located in a volume between the bus bars and the plates.

To suppress ripple in current supplied by the first and second capacitors to a load, ripple suppressing capacitors are connected between the first and second terminals of at least several of the plural capacitors. The ripple suppressing capacitors have values and volumes much less than those of the main capacitors. To assist in minimizing the volumetric requirements for the ripple suppressing capacitors, the first and second segments are spaced from each other by an undulating dielectric stripe having portions that slope with respect to the bus bars and which extend beyond projections of the impedance elements on the boards, i.e., which do not overlay the impedance elements. The filter capacitors have terminals connected to the first and second electrodes of the first and second capacitors via the first and second segments. The filter capacitors are positioned so they straddle the portions of the dielectric stripes that do not overlap the impedance elements.

The above and still further objects, features and advantages of the present invention will become apparent upon consideration of the following detailed description of a specific embodiment thereof, especially when taken in conjunction with the accompanying drawings.

BRIEF DESCRIPTION OF DRAWINGS

FIG. 1 is a top view of a preferred embodiment of a capacitor assembly in accordance with the preferred embodiment o the present invention;

FIG. 2 is a front view of the assembly illustrated in FIG. 1;

FIG. 3 is a back view of the assembly illustrated in FIG. 1;

FIG. 4 is a side view of the assembly illustrated in FIG. 1; and

DESCRIPTION OF THE PREFERRED EMBODIMENTS

Figure 5:
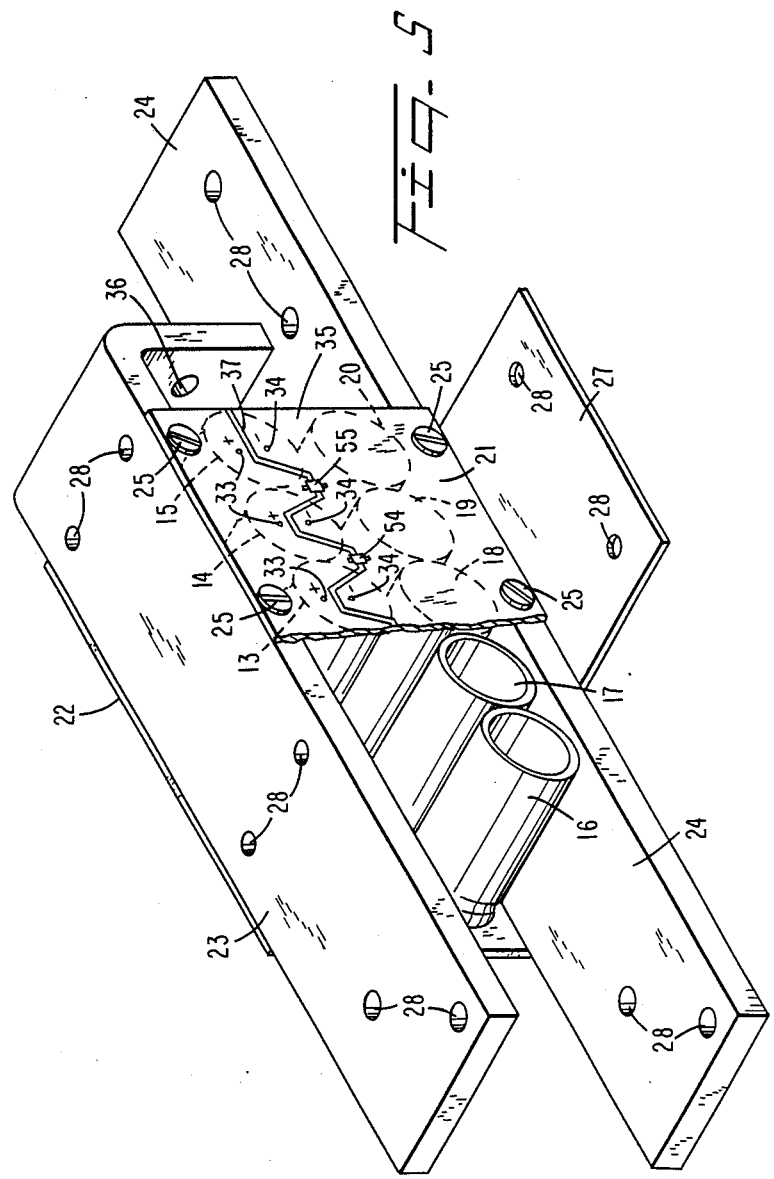
FIG. 5 is a perspective view, partially cut away, of the assembly illustrated in FIG. 1.

Reference is now made to FIGS. 1–5 of the drawing wherein there is illustrated an assembly of ten electrolytic, aluminum capacitors 11–20, disposed between dielectric printed circuit boards 21 and 22, in turn disposed between copper bus bars 23 and 24. To assist in minimizing the volumetric requirements of the assembly illustrated in FIGS. 1–5, capacitors 11–15 are arranged in a first row, with adjacent capacitors having abutting portions, while capacitors 16–20 are arranged in a second row, immediately below the row including capacitors 11–15. Printed circuit boards 21 and 22 are disposed in mutually parallel planes, at right angles to mutually parallel planes containing bus bars 23 and 24 which are also substantially parallel to each other.

First edges of bus bars 23 and 24 are aligned with each other and abut against an interior planar face of printed circuit board 21. Second edges of bus bars 23 and 24 are aligned with each other and abut against an interior planar face of circuit board 22. Printed circuit bards 21 and 22 are secured to bus bars 23 and 24 by screws 25 that extend through the printed circuit boards into threaded bores in the edges of the bus bars.

The assembly includes dielectric mounting board 27, secured to the bottom face of bus bar 24 by screws 28. A heat sink or other fixture is secured to dielectric board 27, as required. Bus bars 23 and 24 are connected to other components, for example, to a choke of a filter capacitor of which the capacitors are a part, by threaded bores 28 therein.

In the preferred use for the assembly, capacitors 11–20 are a part of a low pass filter responsive to a switched power supply that drives a DC load by way of a rectifier. As such, the assembly is responsive to relatively high frequency, for example, 200 kiloHertz, pulses from the switched power supply and rectifier. In one configuration actually constructed, the assembly supplies a load with DC current having a value as great as 600 amperes, at a 6 volt rating. As such, DC bus bar 23 is at a voltage that is 6 volts higher than the voltage of bus bar 24.

Capacitors 11–20 are configured as cylinders having a dielectric, exterior can with mutually parallel dielectric end faces 31 and 32. Positive and negative terminals, i.e., electrodes, 33 and 34 extend in an axial direction from face 31 of each of capacitors 11–20. In a preferred embodiment, each of capacitors 11–20 has a value of about $10^{31\,4}$ microfarads, a diameter of about ½ inch and an axial length of about 1¼ inches.

Electrodes 33 and 34 of capacitors 11–15 extend through mating apertures in printed circuit board 21, while the positive and negative electrodes of capacitors 16–20 extend through mating apertures of printed circuit board 22. Faces 31 of capacitors 11–15 are in approximately abutting relationships with the interior face of printed circuit board 21 while faces 31 of capacitors 16–20 are in approximately abutting relationship with the interior face of printed circuit board 22. Back faces 32 of capacitors 11–15 are in approximately abutting relationship with the interior face of printed circuit board 22, while back faces 32 of capacitors 16–20 are in approximately abutting relationship with the interior face of printed circuit board 21.

Printed circuit board 21 includes, on the exterior face thereof (i.e., the face remote from capacitors 11–15), metal, preferably copper, cladding segments 35 and 36 which are electrically insulated from each other by undulating dielectric stripe 37. Dielectric stripe 37 is formed by etching the cladding originally deposited on the exterior face of printed circuit board 21 so that the bare surface of the dielectric printed circuit board is exposed. Undulating stripe 37 includes sloping portions 38, between which are disposed non-sloping portions 39 and 40. Capacitors 11–15 and non-sloping portions 39 are arranged so that the latter non-sloping portions extend in a plane coincident with the center of each of the capacitors and parallel to the planes of bus bars 23 and 24. Capacitors 11–15 are arranged so that all of electrodes 33 thereof are aligned in a first row, immediately above all of electrodes 34 thereof that are aligned in a second row. All of electrodes 33 are connected to cladding 36 above dielectric stripe 37, thence to bus bar 23. Similarly, but in an opposite manner, all of electrodes 34 of capacitors 11–15 are connected to cladding 35 below dielectric stripe 37, thence to bus bar 24. Electrodes 33 and 34 of capacitors 11–15 are soldered to claddings 35 and 36, preferably by a wave-solder technique.

Capacitors 51–55, having a dielectric exterior case an volume much less than the volume of main capacitors 11–20, include first and second electrodes 71 and 72, arranged so that the first electrodes 71 are soldered by the wave-solder process to cladding 36, while the second electrodes 72 are soldered by the same technique to cladding 35. Capacitors 51–55 are basically ripple suppression capacitors, having an impedance which is low relative to the high frequency pulses derived by the switched power supply source, but which are several orders of magnitude lower in capacitive value than capacitors 11–20.

The undulations of dielectric stripe 37 are arranged so that portions 40 thereof are located approximately in alignment with the lower most tangents of capacitors 11-15, in the gap between adjacent pairs of capacitors 11-15. In other words, the areas of capacitors 11-15, as projected onto plate 21, are removed from portions 40 of stripe 37. This arrangement enables ripple suppressing capacitors 51-55 to be located in a straddling relationship to portions 40 of dielectric stripe 37 without contacting capacitors 11-15. In particular, capacitor 52 straddles portion 40 of dielectric stripe 37 between capacitors 11 and 12, capacitor 53 is disposed between capacitors 12 and 13, capacitor 54 is disposed between capacitors 13 and 14, and capacitor 55 is disposed between capacitors 14 and 15. Capacitor 51, at the extreme left side of printed circuit board 21, as illustrated in FIG. 2, is disposed between the left side of the printed circuit board and capacitor 11.

Dielectric printed circuit board 22 includes copper claddings 56 and 57 which are electrically insulated from each other by dielectric stripe 58. Copper claddings 56 and 57 and dielectric stripe 58 are arranged on printed circuit board 22 in exactly the same manner as copper claddings 35 and 36 are disposed on printed circuit board 21 and dielectric stripe 58 is configured identically to dielectric stripe 37. However, printed circuit board 22 is positioned between bus bars 23 and 24 in an opposite manner to the manner in which printed circuit board 21 is positioned between the bus bars. Positive electrodes 33 of capacitors 16-20 are connected to bus bar 23 by way of metal cladding 56 on circuit board 22, while negative electrodes 34 of capacitors 16-20 are connected to negative bus bar 24 by way of cladding 57. Filter, ripple suppression capacitors 61-65 are connected to claddings 56 and 57 in the same manner that capacitors 51-55 are connected to claddings 35 and 36.

The vertical spacing between capacitors 11-15 and capacitors 16-20 is such that a gap subsists between the aligned lower tangents of the upper row of capacitors 11-15 and the aligned upper tangents of the lower row of capacitors 16-20. Such a gap occurs by proper selection of the spacing between the lower face of bus bar 23 and the upper face of bus bar 24 relative to the diameters of capacitors 11-20. The gap between the upper row of capacitors 11-15 and the lower row of capacitors 16-20 facilitates the laminar flow of air or some other cooling fluid between the upper and lower rows of capacitors to enhance cooling of capacitors 11-20.

From the foregoing, bus bar 23 is connected to the positive electrodes 33 of capacitors 11-20 by claddings 36 and 56 of circuit boards 21 and 22, respectively, wile negative bus bar 24 is connected to the negative electrodes 34 of the capacitors 11-20 by way of claddings 35 and 57 of printed circuit boards 21 and 22, respectively. The arrangement of capacitors 11-20 in the volume between bus bars 23 and 24 and between circuit boards 23 and 24 enables a high component count to be provided in a very small volume, to obtain an enhanced energy storage-density relationship.

While there has been described and illustrated one specific embodiment of the invention, it will be clear that variations in the details of the embodiment specifically illustrated and described may be made without departing from the true spirit and scope of the invention as defined in the appended claims.

We Claims:

1. A capacitor assembly comprising first and second spaced DC bus bars having different voltage levels, first and second spaced plates extending between said first and second bus bars, each of said plates having first and second spaced, mutually insulated electrically conducting segments, plural first main capacitors, plural second main capacitors, each of said main capacitors having first and second opposite polarity electrodes extending from a single side thereof; said capacitors, bus bars and plates being positioned and electrically connected to each other so that: the first electrodes of said first capacitors are electrically connected to the first bus bar via the first segment of the first plate, the second electrodes of said first capacitors are electrically connected to the second bus bar via the second segment of the first plate, the first electrodes of said second capacitors are electrically connected to the first bus bar via the first segment of the second plate, and the second electrodes of said second capacitors are electrically connected to the second bus bar via the second segment of the second plate.

2. The capacitor assembly of claim 1 further including ripple suppressing capacitors connected between the first and second electrodes of at least several of said plural main capacitors, said ripple suppressing capacitors having values much less than values of said plural main capacitors.

3. The capacitor assembly of claim 2 wherein the first and second segments are spaced from each other by an undulating dielectric stripe having portions that slope and which extend beyond portions of the main capacitors, the ripple suppressing capacitors having terminals connected to the first and second electrodes via the first and second segments, the ripple suppressing capacitors being positioned so they straddle the dielectric stripe portions which extend beyond portions of the capacitors.

4. The capacitor assembly of claim 1 wherein said first and second conducting segments are on a common face of each of said plates.

5. The capacitor assembly of claim 1 wherein each of said plates is a dielectric board, said first and second conducting segments on each of said boards being metal cladding areas on a common face of said board, no cladding being provided on said face between said first and second segments so that the dielectric board between the claddings electrically insulates the first and second conducting segments.

6. The capacitor assembly of claim 5 wherein the bus bars are disposed substantially parallel to each other and include substantially aligned edges so that first edges of the first and second bus bars are substantially aligned and second edges of the first an second bus bars are substantially aligned, the plates being electrically and mechanically connected to the bus bars so: the first segment of the first plate is secured to the first edge of the first bus bar, the second segment of the first plate is secured to the first edge of the second bus bar, the first segment of the second plate is secured to the second edge of the first bus bar, and the second segment of the second plate is secured to the second edge of the second bus bar.

7. The capacitor assembly of claim 6 wherein the capacitors are located in a volume between the bus bars and the plates.

8. The capacitor assembly of claim 7 further including ripple suppressing capacitors connected between the first and second electrodes of at least several of said plural capacitors, said ripple suppressing capacitors having values much less than values of said plural capacitors, the first and second segments being spaced from each other by an undulating dielectric stripe having portions that slope and which extend beyond portions of the main capacitors, the ripple suppressing capacitors having terminals connected to the first and second electrodes via the first and second segments, the filter capacitors being positioned so they straddle the dielectric stripe portions which extend beyond portions of the capacitors.

9. The capacitor assembly of claim 5 further including ripple suppressing capacitors connected between the first and second electrodes of at least several of said plural capacitors, said ripple suppressing capacitors having values much less than values of said plural capacitors, the first and second segments being spaced from each other by an undulating dielectric stripe having portions that slope and which extend beyond portions of the main capacitors, the ripple suppressing capacitors having terminals connected to the first and second electrodes via the first and second segments, the filter capacitors being positioned so they straddle the dielectric stripe portions which extend beyond portions of the capacitors.

10. The capacitor assembly of claim 5 wherein the bus bars include substantially aligned edges, so that first edges of the first and second bus bars are substantially aligned and second edges of the first and second bus bars are substantially aligned, the plates being electrically and mechanically connected to the bus bars so: the first segment of the first plate is secured to the first edge of the first bus bar, the second segment of the first plate is secured to the first edge of the second bus bar, the first segment of the second plate is secured to the second edge of the first bus bar, and the second segment of the second plate is secured to the second edge of the second bus bar.

11. The capacitor assembly of claim 10 wherein the main capacitors are located in a volume between the bus bars and the plates.

12. The capacitor assembly of claim 11 further including ripple suppressing capacitors connected between the first and second electrodes of several of said plural capacitors, said ripple suppressing capacitors having values much less than values of said plural capacitors, the first and second segments being spaced from each other by an undulating dielectric stripe, having portions that slope with respect to said bus bars, the ripple suppressing capacitors having terminals connected to the first and second electrodes via the first and second segments, the ripple suppressing capacitors being positioned so they straddle the dielectric stripe portions that slope.

13. The capacitor assembly of claim 10 further including ripple suppressing capacitors connected between the first and second electrodes several of said plural capacitors, said ripple suppressing capacitors having values much less than values of said plural capacitors, the first and second segments being spaced from each other by an undulating dielectric stripe, having portions that slope with respect to said bus bars, the ripple suppressing capacitors having terminals connected to the first and second electrodes via the first and second segments, the ripple suppressing capacitors being positioned so they straddle the dielectric stripe portions that slope.

14. The capacitor assembly of claim 1 wherein the first and second segments of the first and second plates are respectively spaced from each other by first and second dielectric stripes on a common side of the first and second plates, the first and second stripes extending in generally the same direction, all of the first electrodes of the first main capacitors being positioned on a first side of the first dielectric stripe, all of the second electrodes of the first main capacitors being positioned on a second side of the first dielectric stripe, all of the first electrodes of the second main capacitors being positioned on the first side of the second dielectric stripe, all of the second electrodes of the second main capacitors being positioned on the second side of the second dielectric stripe.

15. The capacitor assembly of claim 14 further including first ripple suppressing capacitors positioned and sized to straddle a segment of the first stripe without substantially contacting said first main capacitors, said first ripple suppressing capacitors having opposite polarity electrodes electrically connected to said first and second segments of said first plate; second ripple suppressing capacitors positioned and sized to straddle a segment of the second stripe without substantially contacting said second main capacitors, said second ripple suppressing capacitors having opposite polarity electrodes electrically connected to said first and second segments of said second plate.

16. The capacitor assembly of claim 14 wherein the first and second main capacitors are sized and positioned and the stripes are arranged so that the first main capacitors include aligned lower tangential portions that are spaced from aligned upper tangential portions of the second main capacitors so that a substantial gap subsists between the aligned lower and upper tangential portions to provide a fluid flow path between said aligned upper and lower tangential portions.

17. An assembly of electric impedance elements comprising first and second spaced bus bars having different voltage levels, first and second spaced plates extending between said first and second bus bars, each of said plates having first and second spaced, mutually insulated electrically conducting segments, plural first impedance elements, plural second impedance elements, each of said impedance elements having first and second opposite polarity terminals extending from a single side thereof; said impedance elements, bus bars and plates being positioned and electrically connected to each other so that: the first terminals of said first impedance elements are electrically connected to the first bus bar via the first segment of the first plate, the second terminals of said first impedance elements are electrically connected to the second bus bar via the second segment of the first plate, the first terminals of said second impedance elements are electrically connected to the first bus bar via the first segment of the second plate, and the second terminals of said second impedance elements are electrically connected to the second bus bar via the second segment of the second plate.

18. The assembly of claim 17 further including electric components connected between the first and second terminals of at least several of said plural impedance elements, said components having sizes much less than the sizes of said impedance elements.

19. The assembly of claim 18 wherein the first and second segments are spaced from each other by an undulating dielectric stripe having portions that slope and which extend beyond portions of the impedance elements, the components having terminals connected to the first and second terminals via the first and second segments, the components being positioned so they straddle the dielectric stripe portions which extend beyond portions of the impedance elements.

20. The assembly of claim 17 wherein said first and second conducting segments are on a common face of each of said plates.

21. The assembly of claim 17 wherein each of said plates is a dielectric board, said first and second conducting segments on each of said boards being metal cladding areas on a common face of said board, no cladding being provided on said face between said first and second segments so that the dielectric board between the claddings electrically insulates the first and second conducting segments.

22. The assembly of claim 21 wherein the bus bars are disposed substantially parallel to each other and include substantially aligned edges so that first edges of the first and second bus bars are substantially aligned and second edges of the first and second bus bars are substantially aligned, the plates being electrically and mechanically connected to the bus bars so: the first segment of the first plate is secured to the first edge of the first bus bar, the second segment of the first plate s secured to the first edge of the second bus bar, the first segment of the second plate is secured to the second edge of the first bus bar, and the second segment of the second plate is secured to the second edge of the second bus bar.

23. The assembly of claim 22 wherein the capacitors are located in a volume between the bus bars and the plates.

24. The assembly of claim 23 further including electric components connected between the first and second terminals of at least several of said plural impedance elements, said electric components having volumes much less than volumes of said plural impedance elements, the first and second segments being spaced from each other by an undulating dielectric stripe having portions that slope and which extend beyond portions of the impedance elements, the components having terminals connected to the first and second terminals via the first and second segments, the components being positioned so they straddle the dielectric stripe portions which extend beyond portions of the impedance elements.

25. The assembly of claim 22 further including electric components connected between the first and second terminals of at least several of said plural impedance elements, said electric components having volumes much less than volumes of said plural impedance elements, the first and second segments being spaced from each other by an undulating dielectric stripe having portions that slope and which extend beyond portions of the impedance elements, the components having terminals connected to the first and second terminals via the first and second segments, the components being positioned so they straddle the dielectric stripe portions which extend beyond portions of the impedance elements 26. The assembly of claim 21 wherein the bus bars include substantially aligned edges, so that first edges of the first and second bus bars are substantially aligned and second edges of the first and second bus bars are substantially aligned, the plates being electrically and mechanically connected to the bus bars so: the first segment of the first plate is secured to the first edge of the first bus bar, the second segment of the first plate is secured to the first edge of the second bus bar, the first segment of the second plate is secured to the second edge of the first bus bar, and the second segment of the second plate is secured to the second edge of the second bus bar.

27. The assembly of claim 26 wherein the impedance elements are located in a volume between the bus bars and the plates.

28. The assembly of claim 27 further including electric components connected between the first and second terminals of several of said plural impedance elements, said electric components having volumes much less than volumes of said plural impedance elements, the first and second segments being spaced from each other by an undulating dielectric stripe, having portions that slope with respect to said bus bars, the components having terminals connected to the first and second terminals via the first and second segments, the components being positioned so they straddle the dielectric stripe portions that slope.

29. The assembly of claim 26 further including electric components connected between the first and second terminals of several of said plural impedance elements, said electric components having volumes much less than volumes of said plural impedance elements, the first and second segments being spaced from each other by an undulating dielectric stripe, having portions that slope with respect to said bus bars, the component having terminals connected to the first and second terminals via the first and second segments, the components being positioned so they straddle the electric stripe portions that slope.

30. The assembly of claim 17 wherein the first and second segments of the first and second plates are respectively spaced from each other by first and second dielectric stripes on a common side of the first and second plates, the first and second stripes extending in generally the same direction, all of the first terminals of the first impedance elements being positioned on a first side of the first dielectric stripe, all of the second terminals of the first impedance elements being positioned on a second side of the first dielectric stripe, all of the first terminals of the second impedance elements being positioned on the first side of the second dielectric stripe, all of the second terminals of the second impedance elements being positioned on the second side of the second dielectric stripe.

31. The assembly of claim 30 further including first electric components positioned and sized to straddle a segment of the first stripe without substantially contacting said first plural impedance elements, said electric components having opposite polarity terminals electrically connected to said first and second segments of said first plate; second electric components positioned and sized to straddle a segment of the second stripe without substantially contacting said second plural impedance elements, said second electric components having opposite polarity terminals electrically connected to said first and second segments of said second plate.

32. The assembly of claim 30 wherein the first and second impedance elements are sized and positioned and the stripes are arrange so that the first impedance elements include aligned lower tangential portions that are spaced from aligned upper tangential portions of the second impedance elements so that a substantial gap subsists between the aligned lower and upper tangential portions to provide a fluid flow path between said aligned upper and lower tangential portions.

* * * * *